United States Patent
Lee et al.

(10) Patent No.: US 7,715,259 B2
(45) Date of Patent: *May 11, 2010

(54) WORD LINE DRIVING CIRCUIT AND METHOD OF TESTING A WORD LINE USING THE WORD LINE DRIVING CIRCUIT

(75) Inventors: Jeong-Woo Lee, Ichon (KR); Hyung-Wook Moon, Ichon (KR); Won-Jun Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/181,896

(22) Filed: Jul. 29, 2008

(65) Prior Publication Data
US 2009/0046526 A1 Feb. 19, 2009

(30) Foreign Application Priority Data
Aug. 13, 2007 (KR) .................. 10-2007-0081027

(51) Int. Cl.
*G11C 29/00* (2006.01)
(52) U.S. Cl. .............. 365/201; 365/185.23; 365/230.06
(58) Field of Classification Search .................. 365/201, 365/185.23, 230.06
See application file for complete search history.

(56) References Cited

U.S. PATENT DOCUMENTS

| 5,331,594 | A | 7/1994 | Hotta | |
|---|---|---|---|---|
| 6,236,617 | B1* | 5/2001 | Hsu et al. | 365/230.06 |
| 6,243,308 | B1 | 6/2001 | Lin | |
| 6,396,751 | B1 | 5/2002 | Doong et al. | |
| 6,731,551 | B2 | 5/2004 | Pekny | |
| 7,075,838 | B2 | 7/2006 | Jeung et al. | |
| 2005/0152207 | A1* | 7/2005 | Ikeda et al. | 365/230.06 |

FOREIGN PATENT DOCUMENTS

| JP | 10-334699 | 12/1998 |
|---|---|---|
| JP | 11-120794 | 4/1999 |
| KR | 1020060073045 | 6/2006 |

* cited by examiner

*Primary Examiner*—Hoai V Ho
*Assistant Examiner*—Jason Lappas
(74) *Attorney, Agent, or Firm*—Baker & McKenzie LLP

(57) ABSTRACT

A method of testing a word line using a word line driving circuit comprising; activating a word line by activating a word line driving signal; floating the word line by activating a test mode signal after the activating of the word line; recording data having a predetermined logic value into a memory cell by inputting a write command while the word line is floated; and reading out data from the memory cell by inputting a read command after the recording of data.

12 Claims, 2 Drawing Sheets

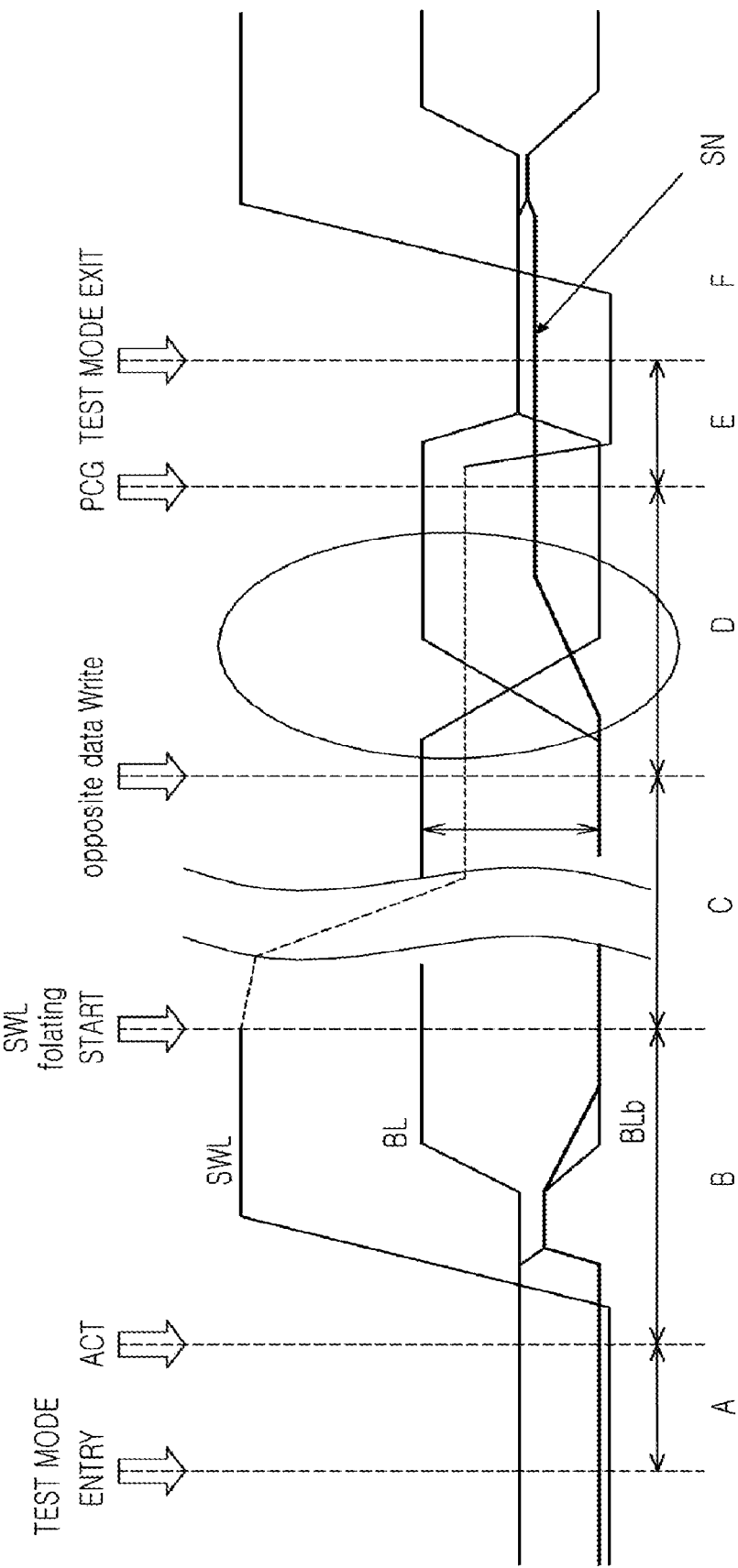

WORD LINE DRIVING CIRCUIT AND METHOD OF TESTING A WORD LINE USING THE WORD LINE DRIVING CIRCUIT

RELATED APPLICATION INFORMATION

The present application claims priority under 35 U.S.C. 119(a) to Korean Patent Application Ser No. 10-2007-0081027, filed on Aug. 13, 2007, in the Korean Patent Office and which is incorporated herein by reference in its entirety as if set forth in full.

BACKGROUND

1. Technical Field

The embodiments described herein relate to a word line driving circuit of a semiconductor memory apparatus, particularly a word line driving circuit having a word line test function and a method of testing a word line using the word line driving circuit.

2. Related Art

Gaps between adjacent word lines or a word line and a bit line of a semiconductor memory apparatus are getting smaller with development of new and improved process technology. As the gap is reduced, a bridge, i.e., an abnormal current path can be formed between the adjacent word lines or a word line and a bit line, which can increase leakage currents between the lines.

In a conventional semiconductor memory apparatus a bit line having a bridge can be detected in a test mode and the bit line having a bridge can be changed with a column repair. Such a test mode operates as follows: First, a charge sharing of bit lines is performed. Next, after the charge sharing is maintained for a predetermined time, data in the bit lines is detected and amplified. When a bridge is formed between the bit line and an adjacent word line, an electrical potential on the bit line will be lost due to the charge sharing that results from the bridge.

When this occurs, there is high probability that the data detected and amplified through the bit line will be error data due to the charge sharing. Thus, the bit line affected by such a bridge can be detected by detecting the error data. The bit line with a data error can then be changed with a column repair such that normal operation is possible.

It is difficult, however, to determine if the abnormal leakage current occurs only with the bit line. Current leaks from both a bit line having the bridge and a word line, and a larger amount of current may leak from the word line than the bit line. Even so, in a conventional semiconductor memory apparatus, only a bit line having a bridge is detected and column repair is applied thereto. No measures are applied to a word line affected by such a bridge, such that it is difficult to solve operational errors of the semiconductor memory apparatus due to an abnormal operation of the word line.

SUMMARY

A word line driving circuit that makes it possible to detect an error of a word line and a method of testing a word line using the word line driving circuit are described herein.

According to one aspect, a word line driving circuit includes a driving portion configured to activate a word line in response to a word line driving signal, and a test control portion configured to float the word line in response to a test mode signal by control the driving portion.

According to another aspect, a method of testing a word line using a word line driving circuit includes activating a word line by activating a word line driving signal, floating the word line by activating a test mode signal after the activating of the word line, recording data having a predetermined logic value into a memory cell by inputting a write command while the word line is floating, and reading data from the memory cell by inputting a read command after the recording of data.

According to another aspect, a method of testing a word line using a word line driving circuit includes activating a word line by activating a word line driving signal and reading out a first logic value recorded in a memory cell, floating the word line by activating a test mode signal after the reading out of data having the first logic value, recording data having a second logic value into the memory cell while the word line is floated, and reading out data recorded in the memory cell after the recording of data having the second logic value.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 2 is a waveform timing diagram illustrating a method of testing a word line using the word line driving circuit of FIG. 1.

DESCRIPTION OF EXEMPLARY EMBODIMENT

Figure 1:
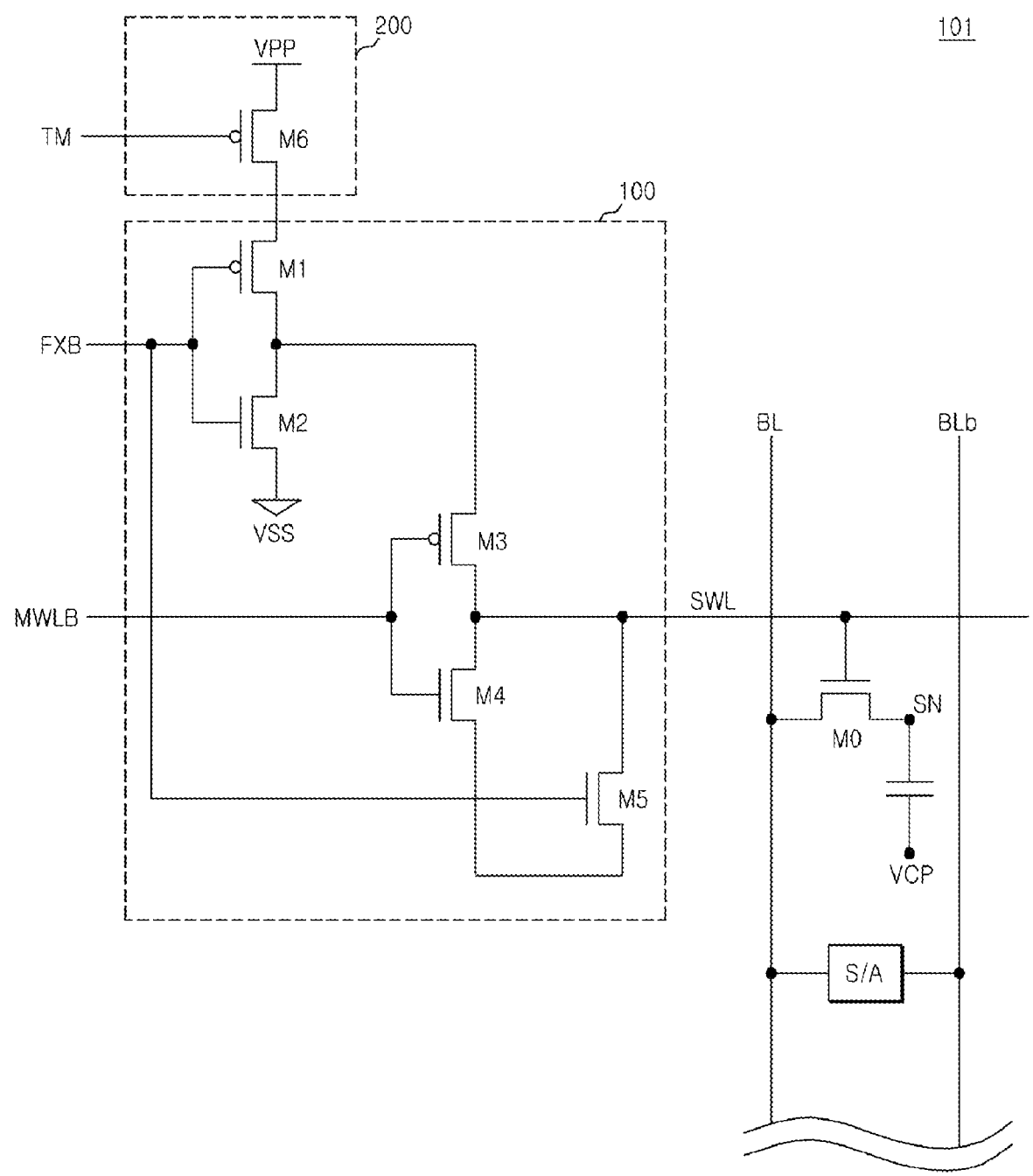
FIG. 1 is a block diagram of a word line driving circuit according to one embodiment.

According to the embodiments described herein, it is possible to accurately detect a word line with an error through a simple test mode. Therefore, it is possible to improve the yield of a semiconductor memory apparatus by minimizing the failure rate of the semiconductor memory apparatus.

FIG. 1 is a diagram illustrating an example word line driving circuit 101 configured in accordance with one embodiment. As shown in FIG. 1, the word line driving circuit 101 can include a driving portion 100 and a test control portion 200. The driving portion 100 can be configured to drive a sub word line SWL in response to a sub word line driving signal FXB and a main word line driving signal MWLB. The driving portion 100 can comprise first to fifth transistors M1 to M5.

The first transistor M1 can comprise a gate, a source and a drain and can be configured to receive the sub word line driving signal FXB through the gate. The second transistor M2 can also comprise a gate, a source and a drain and can be configured to receive the sub word line driving signal FXB through the gate. The source can be grounded and the drain can be connected with the drain of the first transistor M1.

The third and fourth transistors M3 and M4, which also comprise gates, sources, and drains respectively, can be configured to receive the main word line driving signal MWLB through the respective gates. The source of the third transistor M3 can be commonly connected with the drain of the first transistor M1 and the drain of the second transistor M2. The drain of third transistor M3 can be connected to the sub word line SWL. The drain of the fourth transistor M4 can be connected with the sub word line SWL.

The fifth transistor M5 can also comprise a gate, source and drain and can be configured to receive the sub word line driving signal FXB through the gate. The source can be connected with the source of the fourth transistor M4 and the drain can be connected with the sub word line SWL.

The test control portion 200 can be configured to float the sub word line SWL by blocking a current path of the driving portion 100 in response to a test mode signal 'TM'. The test control portion 200 can comprise a sixth transistor M6, which can comprise a gate, source and drain, and that can be configured to receive the test mode signal 'TM' through the gate. The source can be connected to a power terminal VPP and the drain can be connected with the source of the first transistor M1 of the driving portion 100.

A cell transistor M0 of a memory cell block can then be connected to the sub word line SWL and a bit line BL. A sense amp S/A for detecting/amplifying data of the cell transistor M0 can be connected to a pair of bit lines BL, BLb.

FIG. 2 is a waveform diagram illustrating an example method of testing a word line using the word line driving circuit 101.

First, an operation mode of the semiconductor memory apparatus is converted into a test mode. After a time interval (A), a main word line driving signal MWLB and a sub word line driving signal FXB are activated at a low level in response to an active command.

As the main word line driving signal MWLB and a sub word line driving signal FXB are activated, the first and third transistors M1 and M3 are turned on. As the first and third transistors M1 and M3 are turned on, a sub word line SWL is activated in an interval (B) and charge is shared by the pair of bit lines BL and BLb.

After the charge sharing of the pair of bit lines BL and BLb, the sense amp S/A applies a detecting/amplifying process to the pair of bit lines BL and BLb. As the sense amp S/A applies the detecting/amplifying process to the pair of bit lines BL and BLb, a level of a storage node SN of the cell transistor M0 becomes either a high level or a low level.

When the test mode signal 'TM' is activated at a high level, the test control portion 200 blocks the current paths of the power terminal VPP and the driving portion 100. That is, the sixth transistor M6 of the test control portion 200 is turned off and accordingly the current paths of the power terminal VPP and the driving portion 100 are blocked. As the current paths of the power terminal VPP and the driving portion 100 are blocked, the sub word line SWL is floated.

When a bridge is not formed between the sub word line SWL and the adjacent pair of bit lines BL and BLb, the electrical potential level of the sub word line SWL does not drop in an interval (C), maintaining the initial level.

When a bridge is formed between the sub word line SWL and another adjacent sub word line or the pair of bit lines BL and BLb and current leaks through the bridge, the electrical potential of the sub word line SWL gradually drops, as seen in the interval (C) of FIG. 2.

The degree of turning-on the cell transistor M0 depends on the electrical potential of the sub word line SWL, and accordingly the less the electrical potential level of the sub word line SWL, the less the cell transistor M0 is turned on. As the electrical potential loss of the sub word line SWL increases, the cell transistor M0 approaches the turning-off state.

When a predetermined time passes after the sub word line SWL is floated, i.e. in an interval (D), data at an opposite level (e.g. high level) to the data recorded in the cell transistor M0 through the pair of bit lines BL and BLb is recorded into the cell transistor M0.

When the cell transistor M0 is turned off as a result of the decrease in electrical potential level of the sub word line SWL, the high-level data cannot be recorded into the cell transistor M0. That is, it can be seen that the level of a storage node SN of the cell transistor M0 increases to a desired level, i.e. a high level, in the interval (D).

The test mode is finished after the data having the opposite level is recorded, that is, by pre-charging the pair of bit lines BL and BLb and deactivating the test mode signal 'TM' in an interval (E).

After the test mode is finished, the sub word line SWL is activated by inputting an active command in an interval (F) and the data recorded in the cell transistor M0 through the sense amp S/A is read out. Since the test mode is finished and the test mode signal 'TM' is deactivated, the sub word line SWL maintains a normal level.

It can be seen from FIG. 2 that the level of the storage node SN of the cell transistor M0 could not increase to a high level in the intervals (D) to (F) and the data recorded in the cell transistor M0 was correspondingly maintained at the low level.

The data is recorded in the cell transistor M0 as described above, but when the data is not normally recorded, it can be detected that current has leaked from a corresponding sub word line SWL through a bridge.

It is possible to then make the semiconductor memory apparatus normally operate by applying low repair to the sub word line SWL having the error.

The embodiments described above relate to detecting an error in a sub word line SWL, but it can also be applied in the same way to apparatus that only include or use a main word line MWL without a sub word line SWL.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A method of testing a word line using a word line driving circuit comprising:
   activating a word line by activating a word line driving signal;
   floating the word line by activating a test mode signal after the activating of the word line;
   recording data having a predetermined logic value into a memory cell by inputting a write command while the word line is floated; and
   reading out data from the memory cell by inputting a read command after the recording of data.

2. The method of claim 1, further comprising:
   determining whether the word line has an error according to data value read out of the memory cell.

3. The method of claim 2, wherein the determining of whether the word line has an error according to data value read out of the memory cell is determining that the word line has an error when the data value read out of the memory cell is different from a predetermined logic value in the recording of data.

4. The method of claim 1, wherein the floating of the word line is made by blocking a current path of the word line in response to the test mode signal.

5. The method of claim 1, wherein the recording of data having a predetermined logic value is recording data having the opposite logic value to the data recorded in the memory cell before the floating of the word line.

6. The method of claim 1, wherein the inputting of a read command is made after inactivating the test mode signal, after the recording of data.

7. A method of testing a word line using a word line driving circuit comprising:

activating a word line by activating a word line driving signal and reading out a first logic value recorded in a memory cell;

floating the word line by activating a test mode signal after the reading out of data having the first logic value;

recording data having a second logic value into the memory cell while the word line is floated; and reading out data recorded in the memory cell after the recording of data having the second logic value.

8. The method of claim 7, further comprising:

determining whether the word line has an error according to the data value read out of the memory cell after the recording of data having the second logic value.

9. The method of claim 8, wherein the determining of whether the word line has an error is determining that the word line has an error when the data value read out of the memory cell after the recording of data having the second logic value is different from the second logic value.

10. The method of claim 7, wherein the floating of the word line is made by blocking a current path of the word line in response to the test mode signal.

11. The method of claim 7, wherein the first logic value and the second logic value are opposite to each other.

12. The method of claim 7, wherein the reading out of data from the memory cell after the recording of data having the second logic value further includes:

inactivating the test mode signal after the recording of the data having the second logic value.

* * * * *